(12) United States Patent
Lee

(10) Patent No.: US 11,802,905 B2
(45) Date of Patent: Oct. 31, 2023

(54) SYSTEM LEVEL TEST DEVICE FOR MEMORY

(71) Applicant: ATECO INC., Gunpo (KR)

(72) Inventor: Taek Seon Lee, Hwaseong (KR)

(73) Assignee: ATECO INC., Gunpo (KR)

( * ) Notice: Subject to any disclaimer, the term of this patent is extended or adjusted under 35 U.S.C. 154(b) by 11 days.

(21) Appl. No.: 17/610,134

(22) PCT Filed: Jul. 3, 2020

(86) PCT No.: PCT/KR2020/008720
§ 371 (c)(1),
(2) Date: Nov. 9, 2021

(87) PCT Pub. No.: WO2021/029537
PCT Pub. Date: Feb. 18, 2021

(65) Prior Publication Data
US 2022/0236320 A1 Jul. 28, 2022

(30) Foreign Application Priority Data
Aug. 12, 2019 (KR) .................. 10-2019-0098430

(51) Int. Cl.
*G01R 31/28* (2006.01)
(52) U.S. Cl.
CPC ..... *G01R 31/2863* (2013.01); *G01R 31/2867* (2013.01); *G01R 31/2868* (2013.01)
(58) Field of Classification Search
CPC ..... G11C 29/56; G11C 5/04; G11C 29/56008; G11C 29/06; G11C 2029/2602; G11C 2029/5006; G11C 29/02; G01R 31/2893; G01R 31/2867; G01R 31/31905; G01R 31/2863; G01R 31/287; G01R 31/01; G01R 31/2886; G01R 31/31713; G01R 1/0433; G01R 31/2891; G01R 1/0408; G01R 1/0466; G01R 31/286; G01R 1/045; G01R 31/2808; G01R 31/2874; G01R 31/2637; G01R 31/28; G01R 31/2607; G01R 31/003; G01R 31/2851; G01R 31/31724;
(Continued)

(56) References Cited

U.S. PATENT DOCUMENTS 6,178,526 B1 * 1/2001 Nguyen ............... G01R 31/01
714/42
7,509,532 B2 * 3/2009 Co ......................... G11C 29/56
714/25
(Continued)

FOREIGN PATENT DOCUMENTS

JP          2012132896 A        7/2012
KR        20080015622   *      2/2008
(Continued)

*Primary Examiner* — Vinh P Nguyen

(57) ABSTRACT

A memory module system level tester device provides contact between the motherboard and the memory modules by using a test tray, thereby minimizing a time required for attaching and detaching the memory modules and omitting an additional configuration for attaching and detaching the memory modules. Accordingly, space limitations can be minimized, and as a result, test units can be arranged in two or more stages in the vertical direction to configure a compact layout to thereby increase space efficiency.

8 Claims, 13 Drawing Sheets

(58) Field of Classification Search
CPC ........ G01R 31/31919; G01R 31/31935; G01R 31/31903; G01R 31/31912; G06F 11/273; G06F 16/1847; G06F 11/27; G06F 11/2215; G05B 19/4182
See application file for complete search history.

(56) References Cited

U.S. PATENT DOCUMENTS

| | | | | |
|---|---|---|---|---|
| 7,642,105 B2 * | 1/2010 | Co | .................. | G11C 29/88 |
| | | | | 257/E25.011 |
| 7,884,631 B2 * | 2/2011 | Co | .................. | G11C 29/56 |
| | | | | 324/757.04 |
| 7,960,992 B2 * | 6/2011 | Co | .................. | G11C 29/56 |
| | | | | 324/757.01 |
| 8,022,721 B2 * | 9/2011 | Co | .................. | G11C 29/56 |
| | | | | 324/757.01 |

FOREIGN PATENT DOCUMENTS

| | | | |
|---|---|---|---|
| KR | 20080015622 | A | 2/2008 |
| KR | 100820357 | B1 | 4/2008 |
| KR | 20080044931 | A | 5/2008 |
| KR | 20080111874 | A | 12/2008 |
| KR | 20090128044 | A | 12/2009 |
| KR | 100950034 | B1 | 3/2010 |
| KR | 20110081378 | A | 7/2011 |

* cited by examiner

SYSTEM LEVEL TEST DEVICE FOR MEMORY

CROSS-REFERENCE TO RELATED APPLICATION

This application is a national stage application, filed under 35 U.S.C. § 371, of International Patent Application No. PCT/KR2020/008720, filed on Jul. 3, 2020, which claims priority to Korean application No. 10-2019-0098430 filed Aug. 12, 2019, which is incorporated by reference herein in its entirety.

TECHNICAL FIELD

The disclosure relates to a system level test device for memory, and more particularly to a test device for performing a test by mounting a memory module to a motherboard.

BACKGROUND ART

A memory module refers to a main memory unit of a computer, and is detachably mounted to a motherboard. The memory module is subjected to various tests for testing performance of individual modules after manufactured. However, there have been frequent cases where the memory module does not work properly when used as actually mounted to the motherboard even though the memory module's own performance is tested and passed.

Therefore, when the performance of the memory module is tested before shipment, a system level test is performed under the same conditions as the actual motherboard in order to identify whether required performance is satisfied.

In a conventional system level test, the memory module is inserted in and mounted to a socket of the actual motherboard (or mainboard) and then subjected to the test, but there is a problem of inefficient operation because a worker inserts the memory module in the socket of the motherboard in person or a hand inserts the memory modules one by one in the sockets as disclosed in Korean Patent No. 0950034.

DISCLOSURE

Technical Problem

An aspect of the disclosure is to provide a memory test device which can increase a processing speed compared to a conventional memory-module mounting-test device and improve space utilization of the test device.

Technical Solution

To achieve the aspect of the disclosure, there is provided a system level test device for memory comprising: a handler configured to pick up and place memory modules; a test cell comprising a motherboard with sockets to which the memory modules are electrically connectable, the sockets being provided in plurality and arrayed facing toward one side; a test tray configured to load a plurality of memory modules arrayed corresponding to an array of the sockets; a transfer unit configured to transfer the test tray; and a press configured to press the plurality of memory modules to respectively come into electric contact with the plurality of sockets while the plurality of memory modules are being loaded onto the test tray.

Meanwhile, the press may maintain a pressing state for a predetermined period of time to maintain electric connection between the plurality of memory modules and the sockets while the plurality of memory modules are being subjected to a system level test in the test cell.

Meanwhile, the transfer unit may be configured to: transfer the test tray, onto which the plurality of memory modules to be subjected to the system level test are loaded, to a space between the test cell and the press, and transfer the test tray, onto which the plurality of memory modules subjected to the system level test are loaded, to the handler.

Meanwhile, the handler may include: a first hand to transfer and load a plurality of memory modules, which are loaded onto a user tray transferred from an outside, onto the test tray; and a second hand to transfer and load the plurality of memory modules from the test tray, onto which the plurality of memory modules subjected to the system level test are loaded, onto an empty user tray.

Meanwhile, the test cells are provided in plurality, and arrayed up and down in at least two tiers.

Furthermore, the test cell may include a plurality of motherboards, the plurality of motherboards may include at least one socket, and the plurality of sockets may be arrayed to insert the memory modules therein from above.

Meanwhile, the system level test device for memory may further include a test cell rack configured to support the plurality of test cells.

Further, the test cell may be configured to move from the test cell rack in a horizontal direction.

Meanwhile, the system level test device for memory may further include a linear guide to support the test cell so that the test cell can be taken out of the test cell rack in a horizontal direction.

Meanwhile, the plurality of memory modules may be pressed by the press so as to be respectively inserted into the plurality of sockets.

Further, the press may directly press the test tray so that the plurality of memory modules can be respectively inserted into the plurality of sockets.

Furthermore, the press may directly press the plurality of memory modules so that the plurality of memory modules can be respectively inserted into the plurality of sockets.

Advantageous Effects

A system level test device for memory according to the disclosure employs a test tray for contact between a motherboard and a memory module, thereby minimizing time taken in mounting/unmounting the memory module, and avoiding an additional need for an element for mounting/unmounting the memory module. Accordingly, space limitations are minimized, and thus the test units are arrayed up and down in two or more tiers with a compact layout, thereby enhancing spatial efficiency.

MODE FOR CARRYING OUT DISCLOSURE

Figure 1:
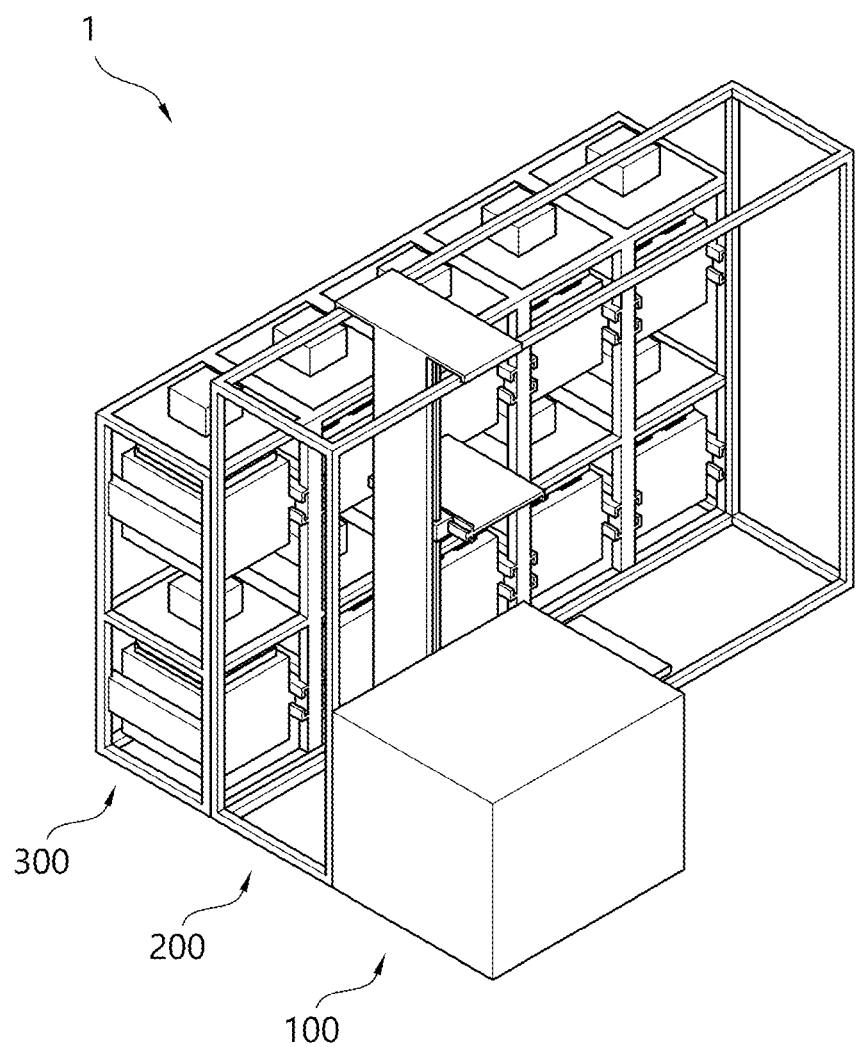
FIG. 1 is a perspective view of a system level test device for memory according to the disclosure.

Below, a system level test device for memory according to embodiments of the disclosure will be described with reference to the accompanying drawings. Further, elements described in the following embodiments may be called by different names in the art. Nevertheless, if the elements called by the different names are functionally analogous or identical to each other, they may be regarded as equivalents of alternative embodiments. Further, reference numerals added to elements are given for convenience of description. However, illustrations indicated by such reference numerals in the drawings do not limit the elements to the range of the drawings. Likewise, even in an alternative embodiment in which some elements in the drawings are modified, such elements may be regarded as equivalents as long as they are functionally analogous or identical to each other. Further, it is natural for those skilled in the art that elements should be included, descriptions about these elements will be omitted.

FIG. 1 is a perspective view of a system level test device for memory 1 according to the disclosure.

As shown therein, the system level test device for memory 1 according to the disclosure is structured to load a memory module 10 fed from the outside onto a test tray 30, subject the memory module 10 to a system level test in a test cell 330, and takes the memory module 10 to the outside.

A system level test device for memory 1 according to the disclosure may include a handler 100, a transfer unit 200, and an array of a test unit 300.

The handler 100 is structured to transfer and load the memory module 10 between a user tray 20 and the test tray 30. The handler 100 is structured to transfer and load the memory module 10 from the user tray 20, which is fed from the outside, to the test tray 30 to perform the system level test, and transfer and load the memory module 10 from the test tray 30 to the user tray 20 to thereby be ready to take the memory module 10 to the outside after the system level test is over.

The transfer unit 200 is structured to transfer the test tray 30 between the test unit 300 and the handler 100. The transfer unit 200 may be movable in six directions so that the test tray 30 can be supplied to or taken out of one test unit 300 in the array of the test unit 300 (to be described later).

The array of the test unit 300 includes a plurality of test units 300, so that a plurality of memory modules 10 can come into electric contact with motherboards 332 and be subjected to a performance test. The test units 300 are arrayed up and down in at least two tiers, and a predetermined number of test units 300 are arrayed in a horizontal direction so that a plurality of test units 300 can perform the system level test at a time.

Meanwhile, although it is not shown, controllers may be provided to control the handler 100, the transfer unit 200, and the test unit 300, respectively.

Below, the function of the handler 100 will be described with reference to FIG. 2.

Figure 2:
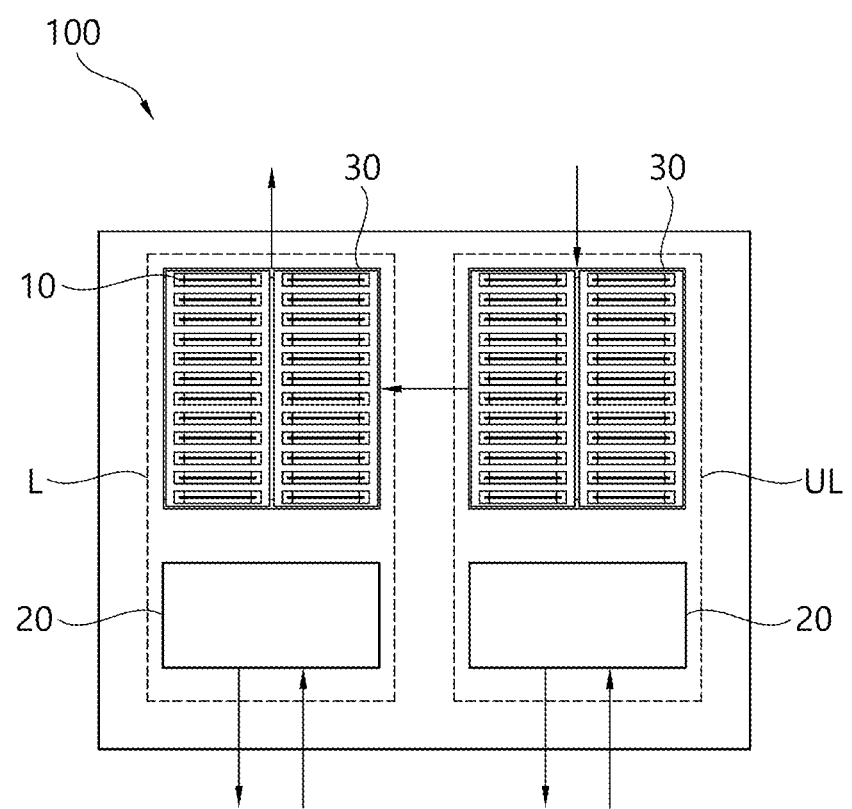
FIG. 2 is a conceptual view showing work spaces divided on a plane in a test handler.

FIG. 2 is a conceptual view showing work spaces divided on a plane in the test handler 100.

As shown therein, a space on the horizontal surface of the test handler 100 may be functionally divided into a loading site L and an unloading site UL. The loading site L refers to a space for loading the memory module 10 onto the test tray 30 to perform the system level test, and the unloading site UL refers to a space for unloading the memory module 10, which has been subjected to the system level test, from the test tray 30 to the user tray 20. Meanwhile, the test tray 30, which has finished the unloading, moves from the unloading site UL to the loading site L and is loaded again with the memory module 10. In other words, the test tray 30 may load and unload the memory module 10 while circulating inside the system level test device for memory 1. The test handler 100 includes a plurality of hands to transfer the module inside the handler 100, which may include a first hand (not shown) being in charge of transferring the memory module 10 in the loading site L, and a second hand (not shown) being in charge of transferring the memory module 10 in the unloading site UL. One side of the loading site L and one side of the unloading site UL are structured to allow the transfer unit 200 enter the handler 100 and transfer the test tray 30. Meanwhile, the other side of the loading site L and the other side of the unloading site UL may be structured to exchange the user tray 20 with the outside, and the user tray 20 may be transferred by an automated guided vehicle (AGV) or the like robot placed outside.

Meanwhile, although it is not shown, the test handler 100 may include a barcode reader to read a barcode or the like identification mark provided in each memory module 10 during the loading, and then the barcode may be stored along with a system level test result and used later in classifying the memory modules 10 by grades.

Below, the structure and function of the transfer unit 200 will be described with reference to FIG. 3.

Figure 3:
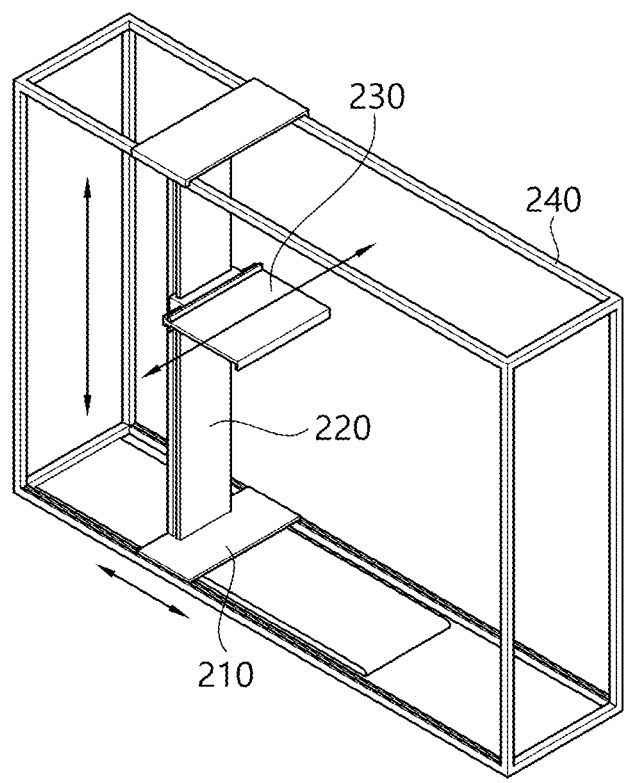
FIG. 3 is a perspective view of a transfer unit.

FIG. 3 is a perspective view of the transfer unit 200. As shown therein, the transfer unit 200 may include a frame 240, a first supporter 210, a second supporter 220, and a pick-up plate 230.

The frame 240 defines a space in which the transfer unit 200 is movable, and is structured to generally support the transfer unit 200.

The first supporter 210 is rectilinearly movable on the frame 240 in left and right directions of FIG. 3 and coupled to the lower frame 240 by a linear guide for a rectilinear motion, and may additionally include an actuator 321.

The second supporter 220 is supported on the first supporter 210 and extended up and down to thereby move the pick-up plate 230 up and down.

The pick-up plate 230 is structured to support or grip the test tray 30. Further, the pick-up plate 230 is rectilinearly movable by a predetermined length so as to exchange the test tray 30 with the handler 100 or the test unit 300. Therefore, the transfer unit 200 gets inside the handler 100 or the test unit 300 to thereby seat the test tray 30 and exit, or gets inside the handler 100 or the test unit 300 to thereby take the test tray 30 out.

Figure 4:
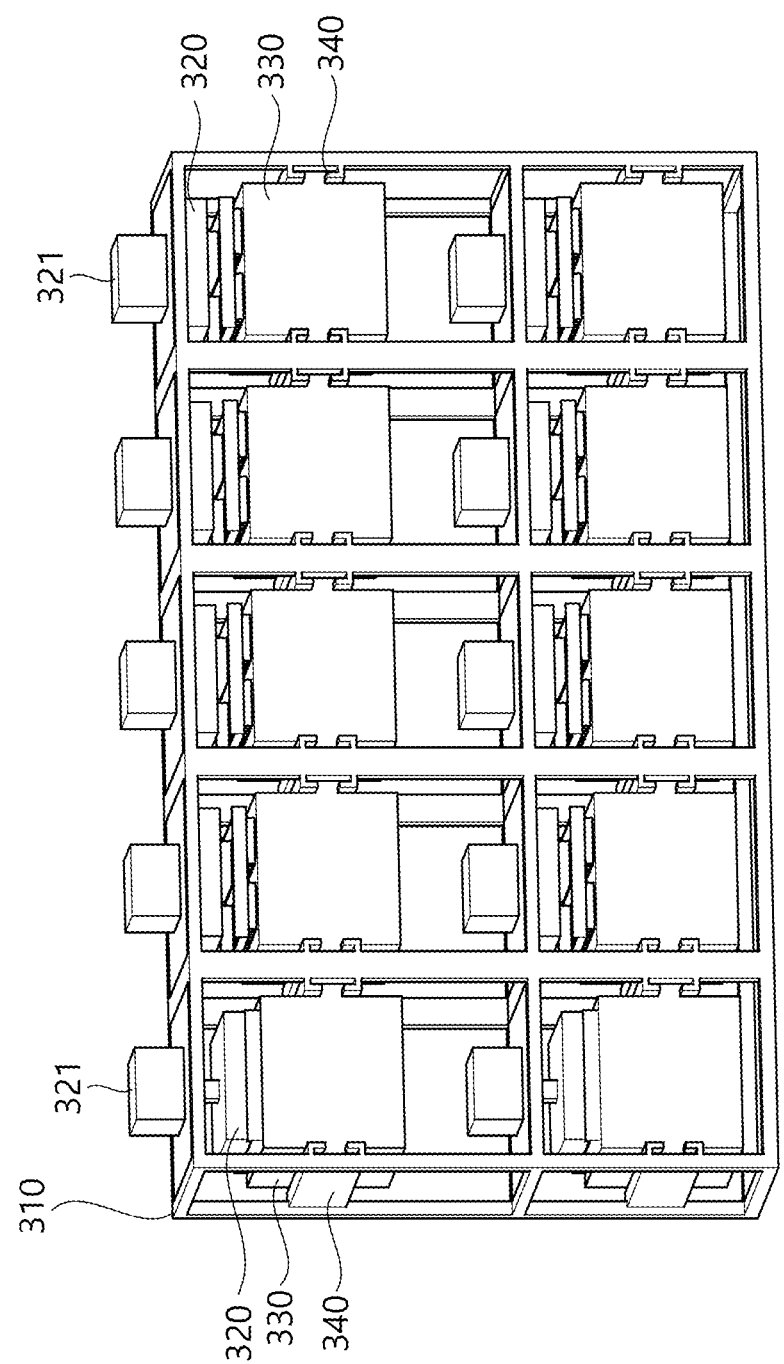
FIG. 4 is a perspective view showing an array of test units.

FIG. 4 is a perspective view showing the array of the test units 300. As shown therein, the test units 300 may be arrayed up and down in at least two tiers, and a predetermined number of test units 300 are arrayed on a plane. Each test unit 300 is supported by a test cell rack 310, so that the array can be maintained. Each test unit 300 may individually perform the test, and allow the test tray 30 to enter and exit. The test unit 300 individually performs the system level test for the plurality of memory modules 10, and allows the transfer unit 200 to enter to take the test tray 30 out after the system level test is terminated and to introduce a new test tray 30 into the test unit 300. Because each test unit 300 individually performs the system level test, it may take a relatively long time, for example, about 1 hour. Accordingly, the test units 300 are provided up and down in at least two tiers, thereby improving spatial efficiency.

Below, the test unit 300 will be described in detail with reference to FIGS. 5 to 8B.

Figure 5:
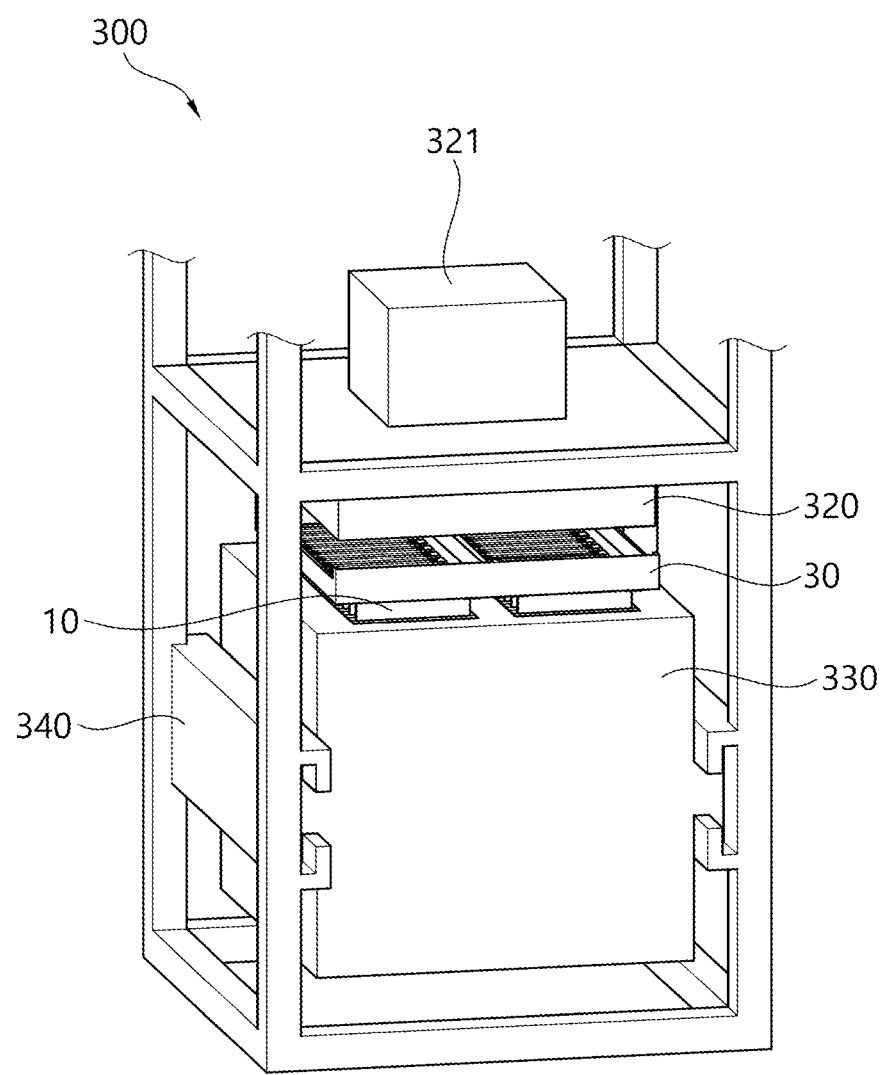
FIG. 5 is a perspective view of a test unit.

FIG. 5 is a perspective view of the test unit 300. As shown therein, the test unit 300 may include a press 320 and the test cell 330 which are provided in the test cell rack 310. The press 320 is provided above the test cell 330, has one side fastened to the test cell rack 310, and structured to press the test tray 30 downward. The press 320 presses the test tray 30 downward, so that the memory module 10 loaded onto the test tray 30 can be inserted into a socket 333 of the test cell 330. The press 320 may be structured to press the test tray 30 itself so that the memory module 10 can be finally inserted into the socket 333, or may be structured to press the memory module 10 itself downward so that the memory module 10 can be inserted into the socket 333. Meanwhile, the press 320 may press the memory module 10 downward while maintaining predetermined pressure to prevent the memory module 10 from separating from the socket 333 during the system level test. The test cell 330 is structured to be internally loaded with a plurality of motherboards 332, and includes a plurality of sockets 333, into which the memory modules 10 are inserted, facing upward. A predetermined distance is kept between the top of the test cell 330 and the bottom of the press 320, and is based on a distance within which the transfer unit 200 enters and picks up and places the test tray 30.

Meanwhile, the test cell 330 may be connected to a linear guide 340 so as to move in planar directions on the test cell rack 310. Therefore, it is possible to pull out the test cell 330 in one direction when a plurality of test units 300 are arrayed, thereby improving accessibility during maintenance.

Figure 6:
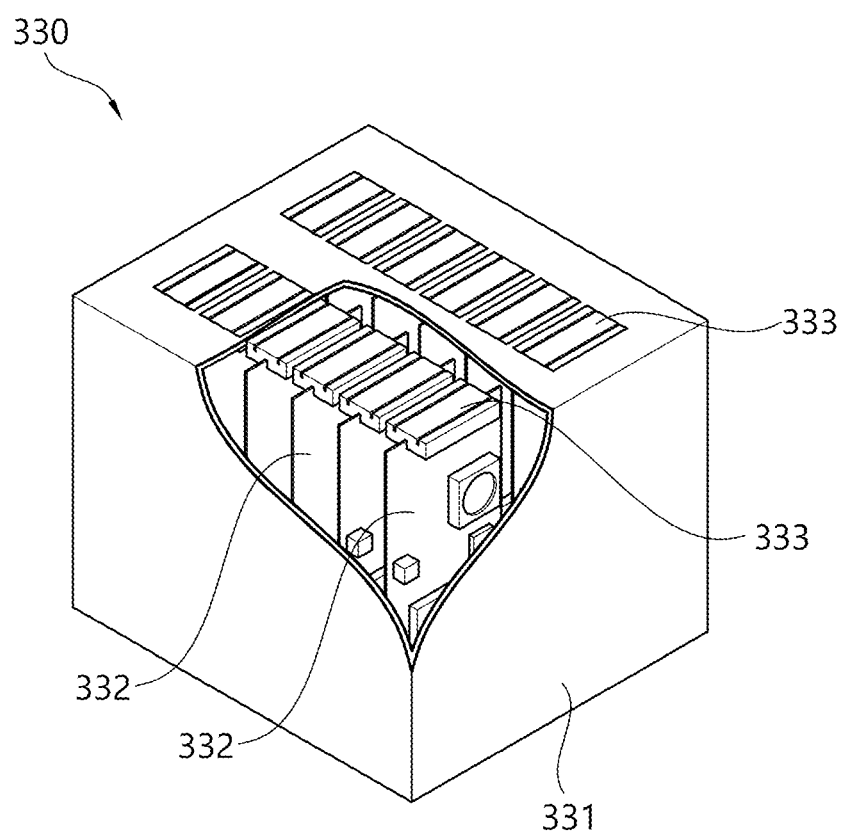
FIG. 6 is a partial cut-open view of a test cell.

FIG. 6 is a partial cut-open view of the test cell 330.

As shown therein, the test cell 330 may include a housing 331, and the plurality of motherboards 332 loaded into the housing 331. The housing 331 is shaped like an overall hexahedron, and loads the motherboards 332 therein with the sockets 333 of which openings are faced upward.

The motherboard 332 may include a plurality of sockets 333 formed facing upward. For example, the motherboard 332 may have the same structure as the actual motherboard 332, but the socket 333 into which the memory module 10 is insertable is changed in position to face upward. For example, the motherboard 332 may include one pair of sockets 333 with memory module insertion slots formed to face upward.

The plurality of motherboards 332 may be arrayed in one or more rows inside the test cell 330. As shown in FIG. 6, the motherboards 332 may be arrayed in two rows, so that the plurality of memory modules 10 can be simultaneously mounted to and electrically connected to the motherboards 332 when moved down as a plane.

FIG. 7A, FIG. 7B, FIG. 8A and FIG. 8B illustrate operating states of the test unit 300.

Figure 7A:
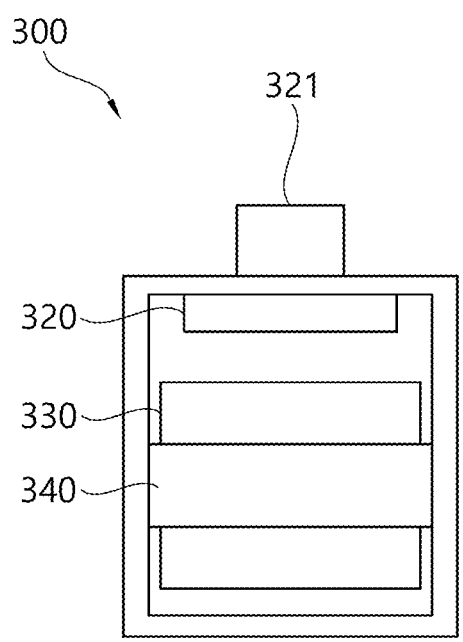
FIG. 7A, FIG. 7B, FIG. 8A and FIG. 8B illustrate operating states of a test unit.

Referring to FIG. 7A, the test unit 300 includes the test cell 330 in a lower side, and the press 320 in an upper side, so that the test tray 30 can be laterally transferred and seated between the test cell 330 and the press 320.

Figure 7B:
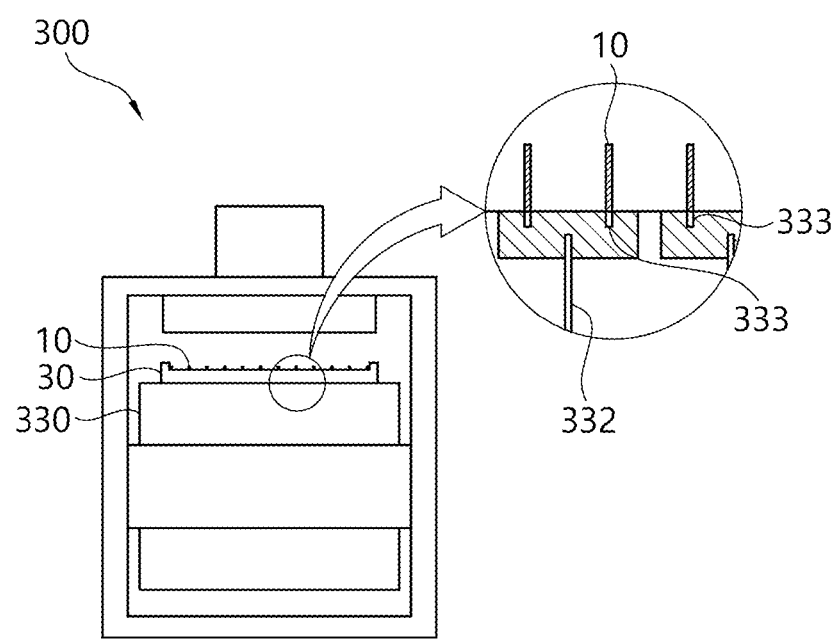

Next, referring to FIG. 7B, when the transfer unit 200 transfers and seats the test tray 30 to the upper side of the test cell 330, the plurality of memory modules 10 seated on the test tray 30 are arrayed to be disposed above the socket 333 as shown in the partial cross-section at the right side of FIG. 7B.

Figure 8A:
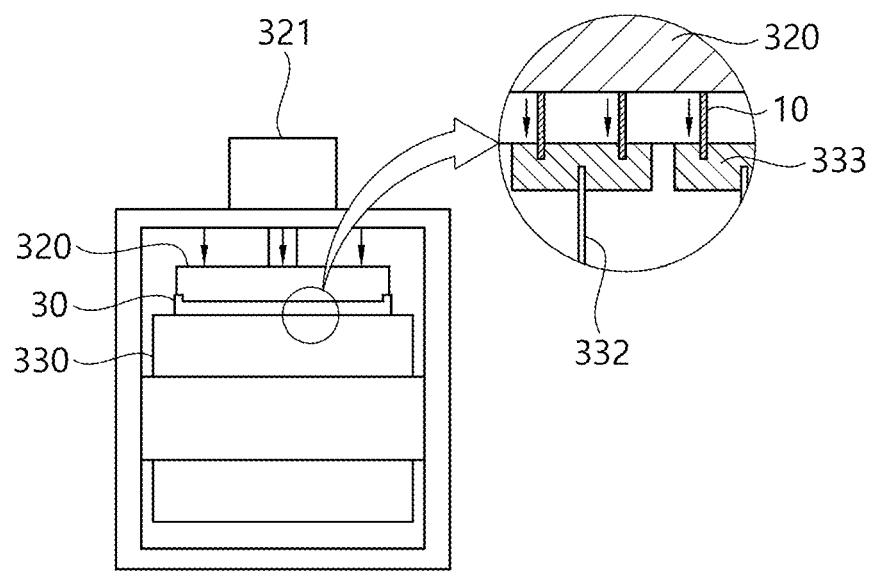

Next, referring to FIG. 8A, the press 320 presses the plurality of memory modules 10, which are loaded onto the test tray 30, downward at the same time, and thus the memory modules 10 are inserted into the sockets 333 of the test cell 330. During the test, the press 320 may continue to press the plurality of memory modules 10 so as to maintain electric connection between the memory modules 10 and the sockets 333. FIG. 8A shows that the press 320 directly presses the memory module 10 from above to be inserted into the socket 333, but, alternatively, the press 320 may directly press the test tray 30 so that the test tray 30 can press the memory module 10 to be inserted into the socket 333.

Figure 8B:
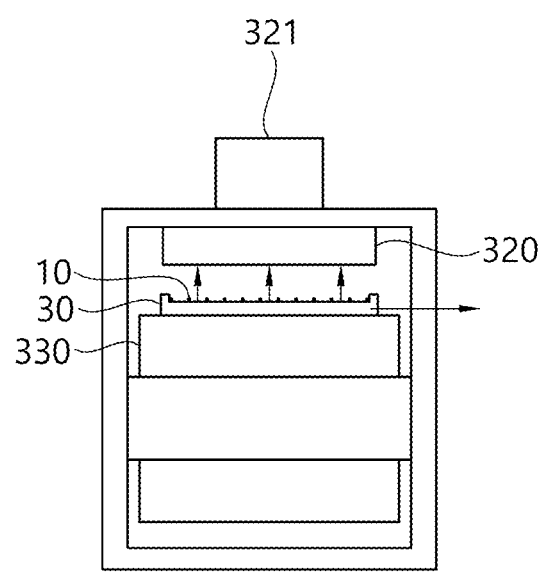

Next, referring to FIG. 8B, after the system level test is over, the press 320 is moved above and returned to the original position, so that the transfer unit 200 can take the test tray 30 out of the test unit 300. Then, the transfer unit 200 transfers the test tray 30 to the unloading site UL of the handler 100, thereby finally unloading the memory modules 10 from the handler 100 to the user tray 20.

Meanwhile, as shown in FIG. 7A, FIG. 7B, FIG. 8A and FIG. 8B, the test tray 30 enters the test unit 300 laterally, and the press 320 provided in the test unit 300 is used to connect the memory module 10 and the socket 333. Therefore, the test units 300 may be arrayed up and down in a plurality of tiers, and have a layout for maximizing the spatial efficiency.

Figure 9A:
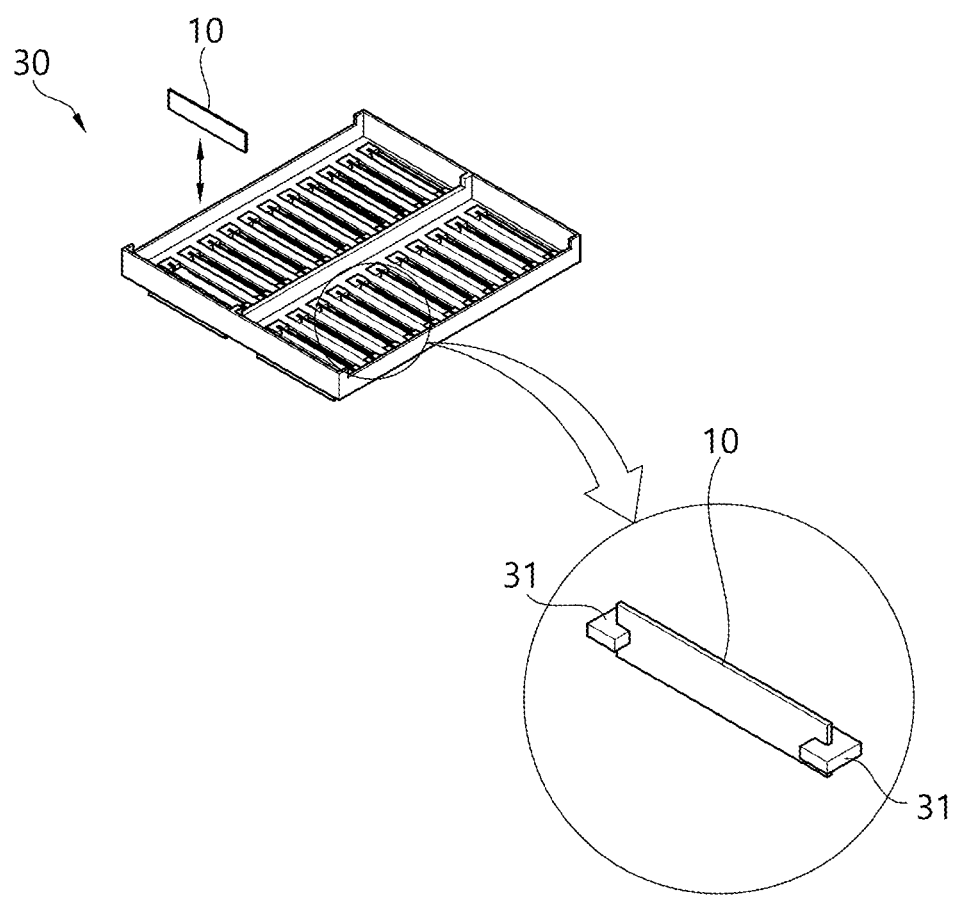
FIG. 9A and FIG. 9B are perspective views of a test tray and a memory module.
Figure 9B:
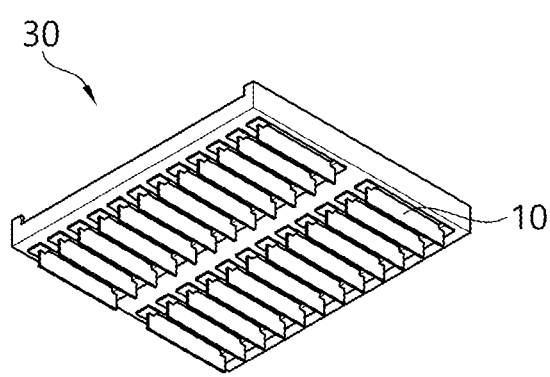

FIG. 9A and FIG. 9B are perspective views of the test tray 30 and the memory module 10. Referring to FIG. 9A, the memory module 10 may have a structure that a plurality of semiconductor devices are provided on a substrate lengthwise extended by a predetermined length. The test tray 30 may include inserts 31 to selectively hold the memory modules 10, in which a plurality of inserts 31 are provided to have a predetermined array. FIG. 9A shows the inserts 31 are provided in two rows. FIG. 9B shows the bottom side of the test tray 30, in which the memory modules 10 are exposed in a downward direction and moved downward by a predetermined length and inserted into the sockets 333 of the test cell 330 when the test tray 30 is pressed from above. However, the array of the inserts shown in FIGS. 9A and 9B is merely an example, and various numbers of inserts may alternatively be arrayed in various rows.

Figure 10:
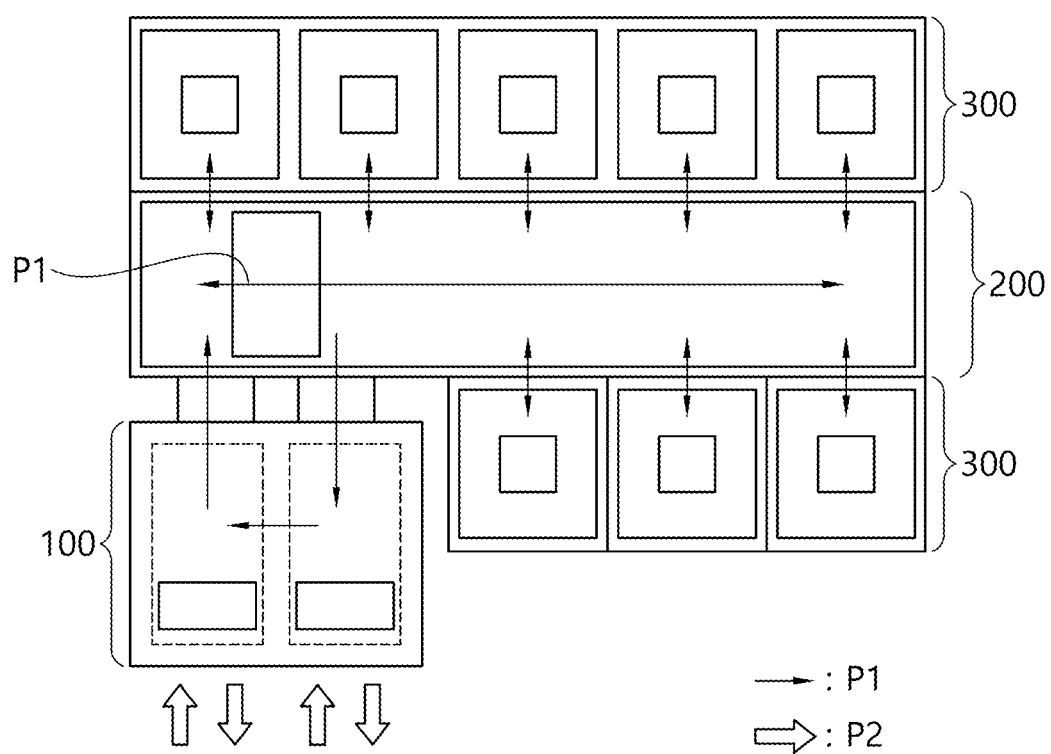
FIG. 10 is a conceptual view showing a layout and a transfer direction on a plane.

FIG. 10 is a conceptual view showing a layout and a transfer direction on a plane. As shown therein, the handler 100 may exchange the user tray 20 with the outside (P2). Further, inside the handler 100, the memory module 10 may be transferred and loaded onto the test tray 30, or, reversely, the memory module 10 may be transferred and loaded from the test tray 30 to the user tray 20. The transfer unit 200 may transfer the test tray 30 between the handler 100 and the test unit 300 (P1).

The transfer unit 200 may horizontally take the test tray 30 out of the test unit 300, of which the system level test is over, in the array of the test units 300, and transfer the taken test tray 30 to the handler 100. Reversely, the transfer unit 200 may transfer the test tray 30 to the test unit 300, which needs the memory module 10 for the system level test, in the array of the test units 300. The test units 300 may be arrayed to be adjacent to each other side by side so that each of the test units 300 is exchange the test tray 30 through the moving space of the transfer unit 200.

Meanwhile, to improve space utilization, at least some test units 300 may be arrayed to face each other with the moving space of the transfer unit 200 therebetween in a horizontal direction. Further, although it is not shown, the test units 300 may be arrayed up and down in two or more tiers. Meanwhile, for maintenance of the test cell 330, each test unit 300 may be structured to move the test cell 330 in a direction opposite to the direction of exchanging the test tray 30.

As described above, the system level test device for memory according to the disclosure employs the test tray for contact between the motherboard and the memory module, thereby minimizing time taken in mounting/unmounting the memory module, and avoiding an additional need for an element for mounting/unmounting the memory module. Accordingly, space limitations are minimized, and thus the test units are arrayed up and down in two or more tiers with a compact layout, thereby enhancing spatial efficiency.

The invention claimed is:

1. A system level test device for memory comprising:
a handler configured to pick up and place memory modules;
a plurality of test cells each comprising at least one motherboard provided with sockets to which the memory modules are electrically connectable, the sockets being provided in plurality and arrayed facing toward one side;
a test tray configured to load a plurality of memory modules arrayed corresponding to an array of the sockets;
a transfer unit configured to transfer the test tray;
a press configured to press the plurality of memory modules to respectively come into electric contact with the plurality of sockets while the plurality of memory modules are being loaded onto the test tray; and
a test cell rack configured to support the plurality of test cells,
wherein the plurality of test cells are arrayed up and down in at least two tiers in the test cell rack.

2. The system level test device for memory according to claim 1, wherein the press maintains a pressing state for a predetermined period of time to maintain electric connection between the plurality of memory modules and the sockets while the plurality of memory modules are being subjected to a system level test in at least one of the test cells.

3. The system level test device for memory according to claim 2, wherein the transfer unit is configured to:
transfer the test tray, onto which the plurality of memory modules to be subjected to the system level test are loaded, to a space between the test cells and the press, and
transfer the test tray, onto which the plurality of memory modules subjected to the system level test are loaded, to the handler.

4. The system level test device for memory according to claim 1, wherein the plurality of memory modules are pressed by the press so as to be respectively inserted into the plurality of sockets.

5. The system level test device for memory according to claim 4, wherein the press directly presses the test tray so that the plurality of memory modules can be respectively inserted into the plurality of sockets.

6. The system level test device for memory according to claim 4, wherein the press directly presses the plurality of memory modules so that the plurality of memory modules can be respectively inserted into the plurality of sockets.

7. The system level test device for memory according to claim 1, wherein each test cell of the plurality of test cells is configured to move from the test cell rack in a horizontal direction.

8. The system level test device for memory according to claim 7, further comprising a linear guide to support an associated test cell so that the associated test cell can be taken out of the test cell rack in a horizontal direction.

* * * * *